(12) United States Patent
Tang et al.

(10) Patent No.: US 11,266,042 B2
(45) Date of Patent: Mar. 1, 2022

(54) REFRIGERATION SYSTEM AND REFRIGERATION METHOD FOR DATA CENTER

(71) Applicant: Beijing Baidu Netcom Science and Technology Co., Ltd., Beijing (CN)

(72) Inventors: Hu Tang, Beijing (CN); Xiaozhong Li, Beijing (CN); Binghua Zhang, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 162 days.

(21) Appl. No.: 16/226,328

(22) Filed: Dec. 19, 2018

(65) Prior Publication Data
US 2019/0208668 A1  Jul. 4, 2019

(30) Foreign Application Priority Data

Dec. 28, 2017 (CN) .......................... 201711459709.8

(51) Int. Cl.
*H05K 7/20* (2006.01)

(52) U.S. Cl.
CPC ..... *H05K 7/20363* (2013.01); *H05K 7/20309* (2013.01); *H05K 7/20318* (2013.01);
(Continued)

(58) Field of Classification Search
CPC ............. H05K 7/2036; H05K 7/20827; H05K 7/20318; H05K 7/20327; H05K 7/20309;
(Continued)

(56) References Cited

U.S. PATENT DOCUMENTS 4,313,310 A * 2/1982 Kobayashi ................ F24F 1/00
62/175
5,209,078 A * 5/1993 Conrad ................ B60H 1/3202
137/62

(Continued)

FOREIGN PATENT DOCUMENTS

CN  102245006 A  * 11/2011  ............. G06F 1/206
CN  102245006 A    11/2011
(Continued)

OTHER PUBLICATIONS

First Office Action and Search Report from CN app. No. 201711459709.8, dated Apr. 4, 2019, with English translation from Global Dossier.
(Continued)

*Primary Examiner* — Eric S Ruppert
*Assistant Examiner* — Kirstin U Oswald
(74) *Attorney, Agent, or Firm* — Ladas & Parry, LLP

(57) ABSTRACT

A refrigeration system and refrigeration method for a data center are disclosed. The refrigeration system includes: a first heat exchanger disposed on a back plate of an indoor cabinet of the data center, and a phase-change heat-exchange cooling tower disposed outdoor of the data center. The first heat exchanger and the phase-change heat-exchange cooling tower are communicated by a secondary refrigerant delivery pipeline. The phase-change heat-exchange cooling tower transfers heat carried in the secondary refrigerant into air and condenses the secondary refrigerant to a liquid again; the secondary refrigerant employs a phase-change heat-exchange working medium. An air pump is disposed in the phase-change heat-exchange cooling tower and on a by-pass of the secondary refrigerant delivery pipeline to pressurize the secondary refrigerant in gas-state delivered in the secondary refrigerant delivery pipeline to increase the condens- (Continued)

ing pressure for condensing the secondary refrigerant to a liquid again.

7 Claims, 3 Drawing Sheets

(52) U.S. Cl.
CPC ..... *H05K 7/20327* (2013.01); *H05K 7/20336* (2013.01); *H05K 7/20827* (2013.01)

(58) Field of Classification Search
CPC ..... H05K 7/20336; F25B 23/00; F25B 39/04; F25B 2339/047; F25B 2339/044
USPC ....................................................... 62/259.2
See application file for complete search history.

(56) References Cited

U.S. PATENT DOCUMENTS

| | | | | |
|---|---|---|---|---|
| 6,085,532 | A * | 7/2000 | Sibik | F25B 49/02 62/177 |
| 2009/0154104 | A1 | 6/2009 | Kondo et al. | |
| 2009/0201645 | A1* | 8/2009 | Kashirajima | H05K 7/20827 361/700 |
| 2011/0198060 | A1 | 8/2011 | Lange et al. | |
| 2012/0048514 | A1* | 3/2012 | Osbaugh | H05K 7/20827 165/104.21 |
| 2013/0333400 | A1* | 12/2013 | Hess | H05K 7/20681 62/62 |
| 2014/0298834 | A1* | 10/2014 | Gast, Jr. | H05K 7/20836 62/119 |
| 2018/0283792 | A1* | 10/2018 | Shin | F28F 25/04 |

FOREIGN PATENT DOCUMENTS

| | | | |
|---|---|---|---|
| CN | 104864765 A | | 8/2015 |
| CN | 105277010 A | | 1/2016 |
| CN | 106871660 A | | 6/2017 |
| CN | 206410283 U | * | 8/2017 |
| CN | 206410283 U | | 8/2017 |
| CN | 206572983 U | | 10/2017 |

OTHER PUBLICATIONS

Third Office Action and search report from CN app. No. 201711459709. 8, dated Apr. 26, 2020, with English translation from Global Dossier.

Second Office action and search report from CN app. No. 201711459709.8, dated Nov. 5, 2019, with English translation from Global Dossier.

* cited by examiner

REFRIGERATION SYSTEM AND REFRIGERATION METHOD FOR DATA CENTER

The present application claims the priority of Chinese Patent Application No. 201711459709.8, filed on Dec. 28, 2017, with the title of "Refrigeration system and refrigeration method for data center". The disclosure of the above applications is incorporated herein by reference in its entirety.

FIELD OF THE DISCLOSURE

The present disclosure relates to the technical field of computer application, and particularly to a refrigeration system and refrigeration method for a data center.

BACKGROUND OF THE DISCLOSURE

With the development of the Internet, data centers are getting bigger and bigger. In order to maintain normal access of users on the Internet, the data center can be equipped with IT equipment such as servers. All IT equipment in the data center will generate a lot of heat during operation, and the accumulation of heat, rise of indoor temperature of the data center will seriously affect the normal operation of the IT equipment in the data center. Therefore, a corresponding cooling system needs to be disposed in the data center to cool the data center and ensure the normal operation of the IT equipment in the data center.

In order to obtain lower cooling energy consumption, a solution is used in the prior art to locate the data center close enough to a cold region and configure free-of-charge cooling schemes, such as direct/indirect free-of-charge cooling on a wind side and indirect free-of-charge cooling on a water side. In particular, the indirect free-of-charge cooling on the water side is applied on a large scale because it is adapted for meeting needs in the construction of large-scale data centers. For example, FIG. 1 is a structural diagram of a refrigeration system for a data center employed in the prior art. As shown in FIG. 1, the data center refrigeration system commonly used in the prior art employs a cooling tower and a plate exchanger (plate-type exchanger) to exchange heat of an evaporation side and a condensation side through an evaporator and a condenser, respectively. For example, in a natural cooling mode, the chilled water comes out of a terminal air conditioner, and after entering the plate exchanger, it exchanges heat with the cooling water; when the chilled water is cooled to a certain temperature, it enters the terminal air conditioner to absorb heat; meanwhile, the chilled water from the cooling tower enters the plate exchanger to absorb the heat of the chilled water, and heats up and then enters the cooling tower for heat dissipation. As shown in FIG. 1, in order to ensure circulation of the chilled water and circulation of cooling water, corresponding valves are also provided to ensure the performance of circulation.

It can be known from the above that the refrigeration system of existing data centers not only has high water consumption, but also causes waste of water resources, and the structure is very complicated and the maintenance costs are high.

SUMMARY OF THE DISCLOSURE

The present disclosure provides a refrigeration system and refrigeration method for a data center, to simplify the current data center structure and reduce the maintenance costs.

The present disclosure provides a refrigeration system for a data center. The system comprises: a first heat exchanger disposed on a back plate of an indoor cabinet of the data center, and a phase-change heat-exchange cooling tower disposed outdoor of the data center;

the first heat exchanger and the phase-change heat-exchange cooling tower are communicated by a secondary refrigerant delivery pipeline; the secondary refrigerant delivery pipeline obtains a secondary refrigerant in liquid-state from the phase-change heat-exchange cooling tower and delivers the secondary refrigerant to the first heat exchanger, the secondary refrigerant absorbs heat on the first heat exchanger and becomes gas to refrigerate for the indoor of the data center where the first heat exchanger lies; the secondary refrigerant delivery pipeline further delivers the secondary refrigerant in gas-state to the phase-change heat-exchange cooling tower, and the phase-change heat-exchange cooling tower transfers heat carried in the secondary refrigerant into air and condenses the secondary refrigerant to a liquid again; the secondary refrigerant employs a phase-change heat-exchange working medium.

Further optionally, in the above system, the phase-change heat-exchange cooling tower comprises a fan, a second heat exchanger, a liquid storage tank and a liquid pump in turn from top to bottom; the secondary refrigerant in liquid-state for refrigeration is pre-stored in the liquid storage tank; the liquid pump is used to press the secondary refrigerant in liquid-state in the liquid storage tank into the secondary refrigerant delivery pipeline;

the secondary refrigerant delivery pipeline is further used to deliver the secondary refrigerant in gas-state into the second heat exchanger, and the second heat exchanger dissipates heat for the secondary refrigerant in gas-state, and then condenses into liquid; and delivers the condensed secondary refrigerant in liquid-state into the liquid storage tank;

the fan above the second heat exchanger is used to dissipate heat for the second heat exchanger so that heat on the second exchanger is quickly transferred into air to achieve heat dissipation.

Further optionally, in the above-mentioned system, an air pump is disposed in the phase-change heat-exchange cooling tower and on a by-pass of the secondary refrigerant delivery pipeline.

Further optionally, in the above-mentioned system, a water storage tray, a water conduit and a water pump disposed in the water conduit are disposed in the phase-change heat-exchange cooling tower, and the water conduit is connected with the water storage tray to spray water in the water storage tray onto an upper surface of the second heat exchanger under the pressure of the water pump.

Further optionally, in the above-mentioned system, the water storage tray is disposed at the bottom of the phase-change heat-exchange cooling tower.

Further optionally, in the above-mentioned system, the liquid pump employs a vacuum charging technology to press the secondary refrigerant in the liquid storage tank into the secondary refrigerant delivery pipeline.

Further optionally, in the above-mentioned system, a back plate of the cabinet and the first heat exchanger are configured to be an integral structure.

The present disclosure further provides a refrigeration method of a refrigeration system for a data center, the method comprising:

a secondary refrigerant delivery pipeline obtains a secondary refrigerant in liquid-state from an outdoor phase-change heat-exchange cooling tower of the data center;

the secondary refrigerant delivery pipeline delivers the secondary refrigerant in liquid-state to a first heat exchanger in the indoor of the data center so that the secondary refrigerant in liquid-state absorbs heat on the first heat exchanger and becomes gas to refrigerate for the indoor of the data center;

the secondary refrigerant delivery pipeline delivers the secondary refrigerant in gas-state to the phase-change heat-exchange cooling tower;

the phase-change heat-exchange cooling tower transfers heat carried in the secondary refrigerant in gas-state into air and condenses the secondary refrigerant to a liquid again.

Further optionally, in the above-mentioned method, the step of the secondary refrigerant delivery pipeline obtaining the secondary refrigerant in liquid-state from the outdoor phase-change heat-exchange cooling tower of the data center specifically comprises:

the liquid pump in the phase-change heat-exchange cooling tower presses the secondary refrigerant in liquid-state stored in the liquid storage tank in the phase-change heat-exchange cooling tower into the secondary refrigerant delivery pipeline so that the secondary refrigerant delivery pipeline obtains the secondary refrigerant in liquid-state from the phase-change heat-exchange cooling tower.

Further optionally, in the above-mentioned method, the step of the secondary refrigerant delivery pipeline delivering the secondary refrigerant in gas-state into the phase-change heat-exchange cooling tower specifically comprises:

the secondary refrigerant delivery pipeline transfers the secondary refrigerant in gas-state to the second heat exchanger in the phase-change heat-exchange cooling tower;

the step of the phase-change heat-exchange cooling tower transferring heat carried in the secondary refrigerant in gas-state into air and condensing the secondary refrigerant to a liquid again specifically comprises:

the second heat exchanger transfers the heat carried in the secondary refrigerant to air under the blowing of the fan located thereabove, and condenses the secondary refrigerant into a liquid again;

furthermore, the method further comprises:

the second heat exchanger delivers the condensed secondary refrigerant into the liquid storage tank.

The refrigeration system and refrigeration method of the data center in the present disclosure, by employing the highly efficient phase-change heat-exchange working medium as the secondary refrigerant, can substantially reduce water consumption, and easily achieve 100% refrigerator-free water-free highly-efficient and energy-saving refrigeration, as compared with the implementation of refrigeration with water resource in the prior art. Furthermore, the refrigeration system according to the present disclosure has a simple structure and can substantially reduce the maintenance costs of the refrigeration system as compared with the refrigeration system by using water resource in the prior art.

DETAILED DESCRIPTION OF PREFERRED EMBODIMENTS

The present disclosure will be described in detail in conjunction with figures and specific embodiments to make objectives, technical solutions and advantages of the present disclosure more apparent.

Figure 1:
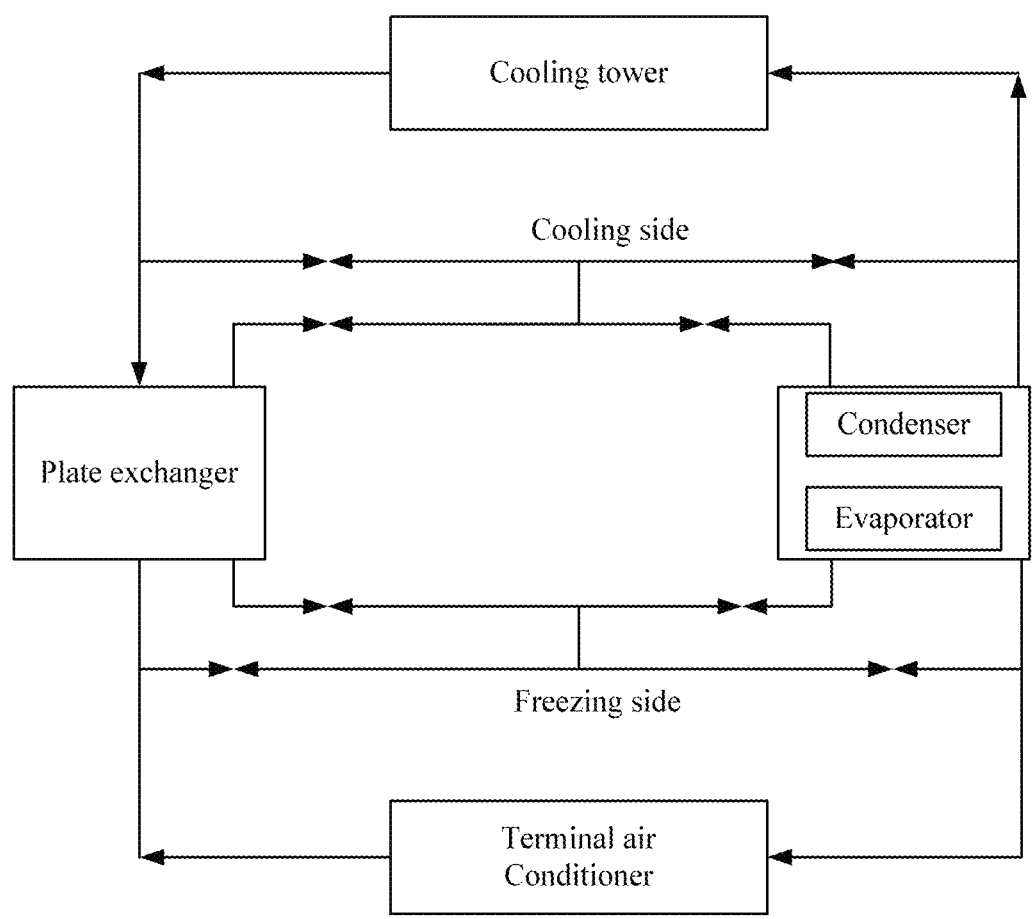
FIG. 1 is a structural diagram of a refrigeration system for a data center employed in the prior art.
Figure 2:
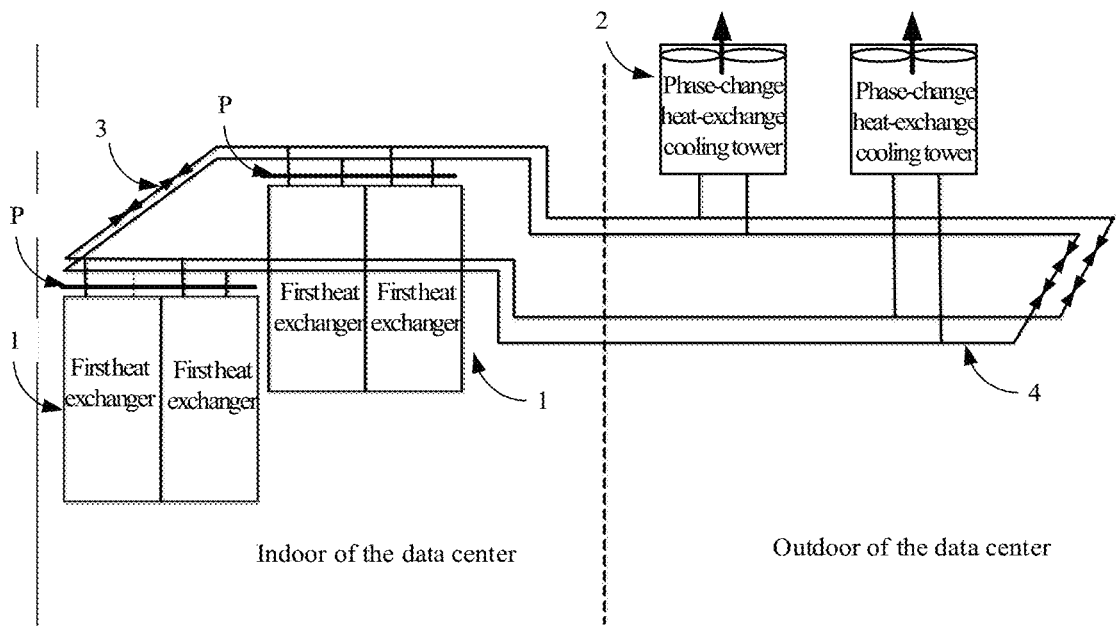
FIG. 2 is a structural diagram of an embodiment of a refrigeration system for a data center according to the present disclosure.

FIG. 2 is a structural diagram of an embodiment of a refrigeration system for a data center according to the present disclosure. As shown in FIG. 2, the refrigeration system of the data center of this embodiment may specifically comprise two portions: namely, a first heat exchanger 1 disposed on a back plate P of an indoor cabinet of the data center, and a phase-change heat-exchange cooling tower 2 disposed outdoor of the data center, wherein the first heat exchanger 1 and the phase-change heat-exchange cooling tower 2 are communicated by a secondary refrigerant delivery pipeline. The secondary refrigerant delivery pipeline of the embodiment may comprise a liquid pipe section and a gas pipe section, wherein the secondary refrigerant delivery pipeline in the liquid pipe section is responsible for delivering secondary refrigerant in liquid-state from the phase-change heat-exchange cooling tower 2 to the first heat exchanger 1. The secondary refrigerant delivery pipeline in the gas pipe section is responsible for delivering secondary refrigerant in gas-state from the first heat exchanger 1 to the phase-change heat-exchange cooling tower 2. In practical application, in order to increase the redundancy of the secondary refrigerant delivery pipeline, it is also possible to dispose two secondary refrigerant delivery pipeline as shown in FIG. 1, wherein a secondary refrigerant delivery pipeline 3 may be used to deliver a secondary refrigerant in liquid-state, and a hot steam delivery pipeline 4 may be used to deliver a secondary refrigerant in gas-state.

In the refrigeration system shown in FIG. 2, an example is taken in which four first heat exchangers and two phase-change heat-exchange cooling towers 2 are employed. In practical application, the number of first heat exchangers 1 located indoor and the phase-change heat-exchange cooling towers 2 located outdoor may not be limited. For example, the system shown in FIG. 2 may be used to refrigerate a plurality of indoors of the data center, and the number of first heat exchangers 1 mounted in each indoor may not be limited; the number of the phase-change heat-exchange cooling towers 2 located outdoor may be set according to actual needs so long as refrigeration of indoors of the data center can be implemented.

Specifically, in the refrigeration system of the data center of the embodiment, the secondary refrigerant delivery pipeline acquires the secondary refrigerant from the phase change exchange cooling tower 2, and delivers the secondary refrigerant to the first heat exchanger 1. The secondary refrigerant absorbs heat on the first heat exchanger 1 to become a gas, thereby refrigerating for the indoor of the data center in which the first heat exchanger 1 is located. Since the first heat exchanger 1 of the present embodiment is located at the back of the cabinet in the indoor of the data center, and what are installed in the cabinet all are some heat-generating electromechanical devices, the first heat exchanger 1 is affected by the surrounding heat-generating electromechanical devices and its temperature is higher. After the low-temperature secondary refrigerant is delivered on the first heat exchanger 1 in this is embodiment, the low-temperature secondary refrigerant can exchange heat on the first heat exchanger 1, absorb heat, and convert the liquid secondary refrigerant into gas, thereby performing cooling and refrigeration for the indoors of the data center. Then, the refrigerant delivery pipeline transfers the gas-state refrigerant to the phase-change heat-exchange cooling tower 2 so that the phase-change heat-exchange cooling tower 2 transfers the heat carried in the secondary refrigerant in gas-state into air, and cools the secondary refrigerant to liquid; the secondary refrigerant in the present embodiment employs a highly efficient phase change heat exchange working medium.

For example, when a server in the data center is working, a large amount of heat is generated. As the largest heat source of the data center, the server is taken as an object for research. The first heat exchanger 1 of this embodiment can be disposed on a back plate P of the cabinet of the server, and even may be provided as an integral structure with the back plate P of the cabinet of the server, for example, the first heat exchanger 1 and the back plate P of the cabinet of the server may be combined together and called a back plate P cabinet, for example as represented by HX Rack. The HX Rack includes the cabinet+the first heat exchanger 1 disposed on the back plate P of the cabinet. When an outlet air temperature of the server is 45° C., if the heat temperature difference of the server is considered as 10 centigrade, the outlet air temperature involved by the first heat exchanger 1 may be 35° C., namely, the inlet air temperature of the server. Then, a supply temperature of the secondary refrigerant on the first heat exchanger 1 is about 31° C., and an approximation temperature of the phase-change heat-exchange cooling tower 2 is 3° C. That is, a maximum allowable wet bulb temperature outside the room is 28° C. In most regions, a wet bulb temperature calculated by an air conditioner in summer is lower than 28° C. Therefore, even though there are cases with the wet bulb temperature being higher than 28° C. in partial time periods in the whole year or life cycle, the phase-change heat-exchange cooling tower 2 still has a micro compression function and solves the heat dissipation temperature during a micro high temperature time period.

In the refrigeration system of the data center in the present embodiment, using the highly efficient phase change heat exchange working medium as the secondary refrigerant can substantially reduce water consumption, save energy consumption, and makes certain contribution to environment protection, as compared with implementing refrigeration with water resource in the prior art. Additionally, effective cooperation of the high temperature resistant air-supply server indoor the data center and the outdoor phase-change heat exchange cooling tower 2 may easily achieve 100% refrigerator-free water-free highly-efficient and energy-saving refrigeration. Furthermore, the refrigeration system according to the present embodiment has a simple structure and can substantially reduce the maintenance costs of the refrigeration system as compared with the refrigeration system by using water resource in the prior art.

Figure 3:
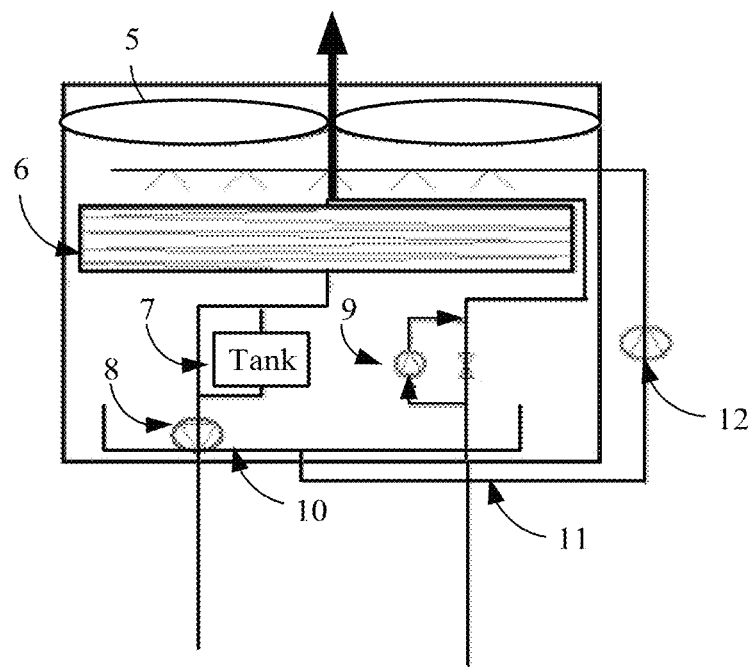
FIG. 3 is a structural view of a phase-change heat exchange cooling tower 2 shown in FIG. 2.

FIG. 3 is a structural view of the phase-change heat-exchange cooling tower 2 shown in FIG. 2. As shown in FIG. 3, the phase-change heat-exchange cooling tower 2 of the present embodiment comprises a fan 5, a second heat exchanger 6, a liquid storage tank 7 and a liquid pump 8 in turn from top to bottom; a secondary refrigerant for refrigeration is pre-stored in the liquid storage tank 7; the liquid pump 8 is used to press the secondary refrigerant in the liquid storage tank 7 into a secondary refrigerant delivery pipeline (e.g., into the secondary refrigerant delivery pipeline 3 shown in FIG. 1).

The secondary refrigerant delivery pipeline (e.g., the secondary refrigerant delivery pipeline 4 shown in FIG. 1) is used to deliver secondary refrigerant in gas-state to the second heat exchanger 6, and the second heat exchanger 6 dissipates heat from the secondary refrigerant in gas-state, and then condenses it into liquid. Specifically, when a fan 5 above the second heat exchanger 6 rotates, it can cause and increase air circulation, and quick heat dissipation is achieved quickly in a way that the heat on the second heat exchanger 6 is quickly transferred into air. In addition, the second heat exchanger 6 delivers the condensed secondary refrigerant in liquid-state into the liquid storage tank 7. Then, the liquid pump 8 presses the secondary refrigerant in the liquid storage tank 7 into the secondary refrigerant delivery pipeline to achieve refrigeration cycle.

Further optionally, as shown in FIG. 3, an air pump 9 is provided in the phase-change heat-exchange cooling tower 2 and on a by-pass of the secondary refrigerant delivery pipeline to improve the condensing pressure.

Further optionally, as shown in FIG. 3, a water storage tray 10, a water conduit 11 and a water pump 12 disposed in the water conduit 11 are disposed in the phase-change heat-exchange cooling tower 2, and the water conduit 11 is connected with the water storage tray 10 to spray the water in the water storage tray 10 onto an upper surface of the second heat exchanger 6 under the pressure of the water pump 12. Preferably, as shown in FIG. 3, the water storage tray 10 of the present embodiment is disposed at the bottom of the phase-change heat-exchange cooling tower 2.

Further optionally, in the embodiment, the liquid pump 8 employs a vacuum charging technology to press the secondary refrigerant in the liquid storage tank 7 into the secondary refrigerant delivery pipeline, so that low pressure differential delivery is achieved, the working pressure is substantially reduced, leakage risk and leakage rate are also substantially reduced, and no need to replenish can be achieved within the life cycle.

The refrigeration system of the data center according to the present embodiment achieves refrigeration in the following process: first, the liquid pump 8 in the phase-change heat-exchange cooling tower 2 employs the vacuum charging technology to press the secondary refrigerant in liquid-state from the liquid storage tank 7 into the secondary refrigerant delivery pipeline; the secondary refrigerant delivery pipeline delivers the carried secondary refrigerant in liquid-state to the first heat exchanger 1 in the data center. The secondary refrigerant in liquid-state encounters the high temperature-resistant air-supply server on the first heat exchanger 1, and absorbs heat to turn the liquid into a gas, thereby cooling and refrigerating the indoor of the data center. Then, the secondary refrigerant delivery pipeline delivers the secondary refrigerant in gas-state to the second heat exchanger 6 in the phase-change heat-exchange cooling tower 2, and the second heat exchanger 6 quickly transfers the heat in the secondary refrigerant in gas-state into air under the action of a fan 5, and delivers the condensed secondary refrigerant in liquid-state to the liquid storage tank 7. Subsequently, the liquid pump 8 can press the secondary refrigerant in the liquid storage tank 7 into the secondary refrigerant delivery pipeline again to achieve a refrigeration cycle.

In practical application, when a dry bulb temperature is high, the water pump 12 may be turned on, water is taken by the water conduit 11 from the water storage tray 10, and sprayed to the upper surface of the second heat exchanger 6 under the pressure of the water pump 12. The second heat exchanger 6 is cooled by latent heat of evaporation of water steam.

Moreover, in the case of weather with an extremely high wet bulb temperature, the air pump 9 may be turned on to pressurize the secondary refrigerant in gas-state delivered in the secondary refrigerant delivery pipeline to increase the condensing pressure, continue to obtain liquid cooling, reduce the condensing time of the secondary refrigerant in gas-state, and improve the condensing effect.

In the refrigeration system of the data center in the present embodiment, employing the above technical solution can substantially reduce water consumption, save energy consumption, and makes certain contribution to environment protection, as compared with implementing refrigeration with water resource in the prior art. Additionally, effective cooperation of the high temperature-resistant air-supply server indoor the data center and the outdoor phase-change heat exchange cooling tower 2 may easily achieve 100% refrigerator-free water-free highly-efficient and energy-saving refrigeration. Furthermore, the refrigeration system according to the present embodiment has a simple structure and can substantially reduce the maintenance costs of the refrigeration system as compared with the refrigeration system by using water resource in the prior art.

Figure 4:
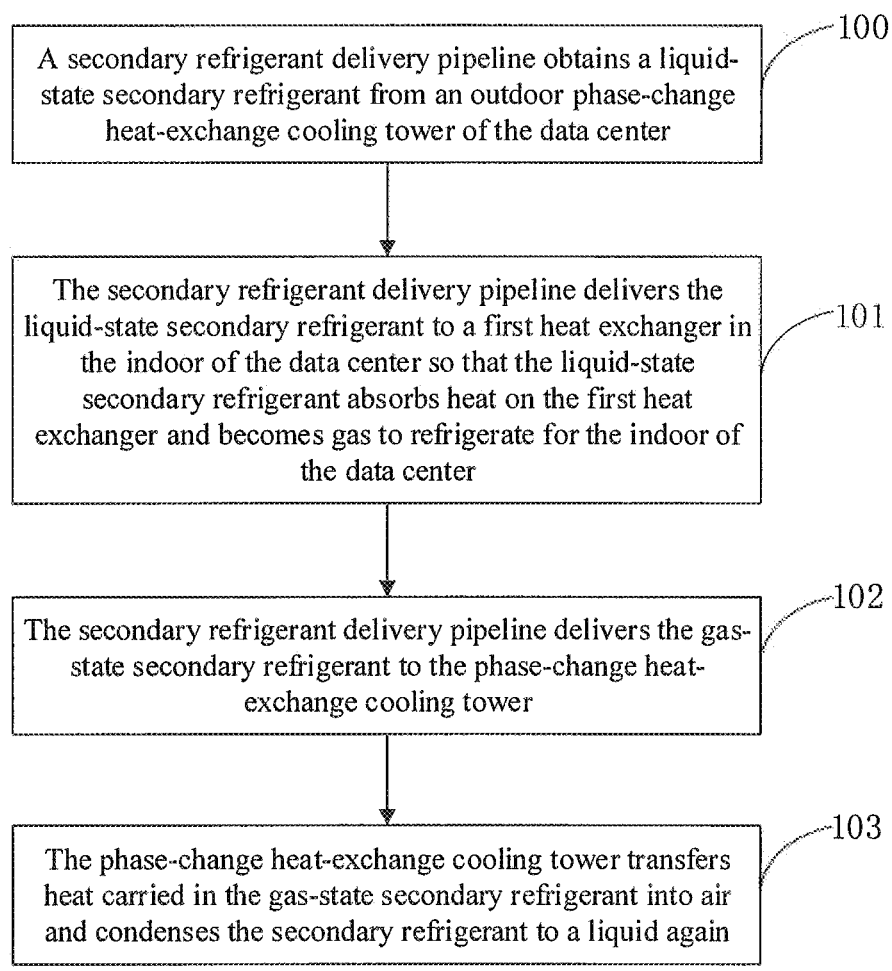
FIG. 4 is a flow chart of a refrigeration method of a refrigeration system for a data center according to the present disclosure.

FIG. 4 is a flow chart of a refrigeration method of a refrigeration system for a data center according to the present disclosure. The refrigeration method of the present embodiment is a method of refrigerating using the refrigeration system shown in above FIG. 2-FIG. 3. As shown in FIG. 4, the refrigeration method of the refrigeration system of the data center of the present embodiment may specifically comprise the following steps:

100: The secondary refrigerant delivery pipeline obtains the secondary refrigerant in liquid-state from the outdoor phase-change heat-exchange cooling tower of the data center;

101: The secondary refrigerant delivery pipeline delivers the secondary refrigerant in liquid-state to the first heat exchanger in the indoor of the data center so that the secondary refrigerant in liquid-state absorbs heat on the first heat exchanger and becomes gas to refrigerate for the indoor of the data center;

102: The secondary refrigerant delivery pipeline delivers the secondary refrigerant in gas-state to the phase-change heat-exchange cooling tower;

103: The phase-change heat-exchange cooling tower transfers heat carried in the secondary refrigerant in gas-state into air and condenses the secondary refrigerant to a liquid again.

The refrigeration method of the refrigeration system of the data center of the present embodiment achieves refrigeration on the same principle as the refrigeration of the above-mentioned refrigeration system. For particulars, please refer to the above depictions of the relevant system, and details are not presented any more here.

Further optionally, in the refrigeration method of the refrigeration system of the data center of the above embodiment, step 100 "the secondary refrigerant delivery pipeline obtains the secondary refrigerant in liquid-state from the outdoor phase-change heat-exchange cooling tower of the data center" may specifically comprise:

the liquid pump in the phase-change heat-exchange cooling tower presses the secondary refrigerant in liquid-state stored in the liquid storage tank in the phase-change heat-exchange cooling tower into the secondary refrigerant delivery pipeline so that the secondary refrigerant delivery pipeline obtains the secondary refrigerant in liquid-state from the phase-change heat-exchange cooling tower.

Further optionally, in the refrigeration method of the refrigeration system of the data center of the above embodiment, step 102 "the secondary refrigerant delivery pipeline delivers the secondary refrigerant in gas-state to the phase-change heat-exchange cooling tower" may specifically comprise:

the secondary refrigerant delivery pipeline transfers the secondary refrigerant in gas-state to the second heat exchanger in the phase-change heat-exchange cooling tower;

correspondingly, step 103 "the phase-change heat-exchange cooling tower transfers heat carried in the secondary refrigerant in gas-state into air and condenses the secondary refrigerant to a liquid again" may specifically comprise:

the second heat exchanger transfers the heat carried in the secondary refrigerant to air under the blowing of the fan located thereabove, and condenses the secondary refrigerant into a liquid again;

furthermore, the refrigeration method of the refrigeration system of the data center of the above embodiment may further include:

the second heat exchanger delivers the condensed secondary refrigerant into the liquid storage tank to achieve a refrigeration cycle.

Further optionally, the refrigeration method of the refrigeration system of the data center of the above embodiment may further comprise:

when a dry bulb temperature is high, the water conduit in the phase-change heat-exchange cooling tower takes water from the water storage tray under a pressure from the water pump, and sprays water to an upper surface of the second heat exchanger, to use latent heat of evaporation of water steam to cool the second heat exchanger.

Further optionally, the refrigeration method of the refrigeration system of the data center of the above embodiment may further comprise; in the case of weather with an extremely high wet bulb temperature, the air pump in the phase-change heat-exchange cooling tower pressurize the secondary refrigerant in gas-state delivered in the secondary refrigerant delivery pipeline to increase the condensing pressure.

The refrigeration method of the refrigeration system of the data center of the present embodiment achieves refrigeration on the same principle as the refrigeration of the above-mentioned refrigeration system. For particulars, please refer to the above depictions of the relevant system, and details are not presented any more here.

What are stated above are only preferred embodiments of the present disclosure and not intended to limit the present disclosure. Any modifications, equivalent is substitutions and improvements made within the spirit and principle of the present disclosure all should be included in the extent of protection of the present disclosure,

What is claimed is:

1. A refrigeration system for a data center, the system comprising: a first heat exchanger disposed on a back plate of an indoor cabinet of the data center, and a phase-change heat-exchange cooling tower disposed outdoor of the data center;

the first heat exchanger and the phase-change heat-exchange cooling tower are communicated by a secondary refrigerant delivery pipeline; the secondary refrigerant delivery pipeline obtains a secondary refrigerant in liquid-state from the phase-change heat-exchange cooling tower and delivers the secondary refrigerant to the first heat exchanger, the secondary refrigerant absorbs heat on the first heat exchanger and becomes gas to refrigerate for the indoor of the data center where the first heat exchanger lies; the secondary refrigerant delivery pipeline further delivers the secondary refrigerant in gas-state to the phase-change heat-exchange cooling tower, and the phase-change heat-exchange cooling tower transfers heat carried in the secondary refrigerant into air and condenses the secondary refrigerant to a liquid again; the secondary refrigerant employs a phase-change heat-exchange working medium, the phase-change heat-exchange cooling tower comprises a fan, a second heat exchanger, a liquid storage tank and a liquid pump in turn from top to bottom; the secondary refrigerant in liquid-state for refrigeration is pre-stored in the liquid storage tank; the liquid pump is used to press the secondary refrigerant in liquid-state in the liquid storage tank into the secondary refrigerant delivery pipeline; the secondary refrigerant delivery pipeline is further used to deliver the secondary refrigerant in gas-state into the second heat exchanger, and the second heat exchanger dissipates heat for the secondary refrigerant in gas-state, and then condenses the secondary refrigerant into liquid; and delivers the condensed secondary refrigerant liquid-state into the liquid storage tank; the fan above the second heat exchanger is used to dissipate heat for the second heat exchanger so that heat on the second exchanger is quickly transferred into air to achieve heat dissipation, an air pump is disposed in the phase-change heat-exchange cooling tower and on a by-pass of the secondary refrigerant delivery pipeline to pressurize the secondary refrigerant in gas-state delivered in the secondary refrigerant delivery pipeline to increase the condensing pressure for condensing the secondary refrigerant to a liquid again.

2. The system according to claim 1, wherein the system further comprising a water storage tray, a water conduit and a water pump disposed in the water conduit which are disposed in the phase-change heat-exchange cooling tower, and the water conduit is connected with the water storage tray to spray water in the water storage tray onto an upper surface of the second heat exchanger under the pressure of the water pump.

3. The system according to claim 2, wherein the water storage tray is disposed at the bottom of the phase-change heat-exchange cooling tower.

4. The system according to claim 1, wherein the liquid pump is a vacuum pump which employs a vacuum charging technology to press the secondary refrigerant in the liquid storage tank into the secondary refrigerant delivery pipeline.

5. The system according to claim 1, wherein the back plate of the cabinet and the first heat exchanger are configured to be an integral structure.

6. A refrigeration method of a refrigeration system for a data center,
wherein the system comprises: a first heat exchanger disposed on a back plate of an indoor cabinet of the data center, and a phase-change heat-exchange cooling tower disposed outdoor of the data center; the first heat exchanger and the phase-change heat-exchange cooling tower are communicated by a secondary refrigerant delivery pipeline, the method comprising the following steps:
the secondary refrigerant delivery pipeline obtains a secondary refrigerant in liquid-state from the outdoor phase-change heat-exchange cooling tower of the data center;
the secondary refrigerant delivery pipeline delivers the secondary refrigerant in liquid-state to the first heat exchanger in the indoor of the data center so that the secondary refrigerant in liquid-state absorbs heat on the first heat exchanger and becomes gas to refrigerate for the indoor of the data center;
the secondary refrigerant delivery pipeline delivers the secondary refrigerant in gas-state to the phase-change heat-exchange cooling tower;
the phase-change heat-exchange cooling tower transfers heat carried in the secondary refrigerant in gas-state into air and condenses the secondary refrigerant to a liquid again;
wherein the step of the secondary refrigerant delivery pipeline delivering the secondary refrigerant in gas-state into the phase-change heat-exchange cooling tower specifically comprises:
the secondary refrigerant delivery pipeline transfers the secondary refrigerant in gas-state to the second heat exchanger in the phase-change heat-exchange cooling tower;
the step of the phase-change heat-exchange cooling tower transferring heat carried in the secondary refrigerant in gas-state into air and condensing the secondary refrigerant to a liquid again specifically comprises:
the second heat exchanger transfers the heat carried in the secondary refrigerant to air under the blowing of the fan located thereabove, and condenses the secondary refrigerant into a liquid again;
the method further comprises: an air pump is disposed in the phase-change heat-exchange cooling tower and on a by-pass of the secondary refrigerant delivery pipeline to pressurize the secondary refrigerant in gas-state delivered in the secondary refrigerant delivery pipeline to increase the condensing pressure for condensing the secondary refrigerant to a liquid again;
the second heat exchanger delivers the condensed secondary refrigerant into the liquid storage tank.

7. The method according to claim 6, wherein the step of the secondary refrigerant delivery pipeline obtaining the secondary refrigerant in liquid-state from the outdoor phase-change heat-exchange cooling tower of the data center comprising the following steps:
the liquid pump in the phase-change heat-exchange cooling tower presses the secondary refrigerant in liquid-state stored in the liquid storage tank in the phase-change heat-exchange cooling tower into the secondary refrigerant delivery pipeline so that the secondary refrigerant delivery pipeline obtains the secondary refrigerant in liquid-state from the phase-change heat-exchange cooling tower.

* * * * *